(12) United States Patent
Odaka et al.

(10) Patent No.: US 6,758,389 B1
(45) Date of Patent: Jul. 6, 2004

(54) COMPOSITION FOR PREVENTING CREEPING OF A FLUX FOR SOLDERING AND USE THEREOF

(75) Inventors: Syunji Odaka, Chigasaki (JP); Yutaka Fukatsu, Chigasaki (JP)

(73) Assignee: Seimi Chemical Co., Ltd., Chigasaki (JP)

( * ) Notice: Subject to any disclaimer, the term of this patent is extended or adjusted under 35 U.S.C. 154(b) by 35 days.

(21) Appl. No.: 10/069,513

(22) PCT Filed: Nov. 2, 2000

(86) PCT No.: PCT/JP00/07726

§ 371 (c)(1),
(2), (4) Date: Mar. 4, 2002

(87) PCT Pub. No.: WO01/32351

PCT Pub. Date: May 10, 2001

(30) Foreign Application Priority Data

Nov. 2, 1999 (JP) ............................................ 11-312341

(51) Int. Cl.⁷ ............................. B23K 1/20; B23K 31/02
(52) U.S. Cl. ...................................... 228/207; 228/223
(58) Field of Search ............................... 228/207, 223; 524/506, 520, 462, 805, 806

(56) References Cited

U.S. PATENT DOCUMENTS

| | | | | |
|---|---|---|---|---|
| 5,292,796 A | * | 3/1994 | Dams et al. ................ | 524/598 |
| 5,316,825 A | * | 5/1994 | Nakai et al. ................ | 428/156 |
| 5,498,657 A | * | 3/1996 | Sugiyama et al. .......... | 524/463 |
| 5,510,406 A | * | 4/1996 | Matsuo et al. .............. | 524/237 |
| 5,712,335 A | * | 1/1998 | Tsuda et al. ................ | 524/269 |
| 5,977,241 A | * | 11/1999 | Koloski et al. ............. | 524/502 |
| 6,069,191 A | * | 5/2000 | Tanaka et al. .............. | 523/201 |
| 6,174,964 B1 | * | 1/2001 | Jariwala et al. ............. | 525/276 |
| 6,203,912 B1 | * | 3/2001 | Watakabe et al. .......... | 428/421 |
| 6,284,843 B1 | * | 9/2001 | Jariwala et al. ............. | 525/276 |
| 6,391,807 B1 | * | 5/2002 | Jariwala et al. ............. | 442/327 |
| 6,495,624 B1 | * | 12/2002 | Brown ........................ | 524/462 |

FOREIGN PATENT DOCUMENTS

| | | | |
|---|---|---|---|
| EP | 0 191 882 | | 8/1986 |
| JP | 362158756 A | * | 7/1987 |
| JP | 01 174553 | | 7/1989 |
| JP | 07 201501 | | 12/1995 |
| JP | WO 01/32351 A1 | * | 5/2001 |
| JP | 02001135926 A | * | 5/2001 |
| WO | 99 03637 | | 1/1999 |

* cited by examiner

*Primary Examiner*—Kiley Stoner
(74) *Attorney, Agent, or Firm*—Oblon, Spivak, McClelland, Maier & Neustadt, P.C.

(57) ABSTRACT

A composition for preventing creeping for a flux for soldering, which is free from a problem from the viewpoint of the global environment or working environment is provided. The composition comprising a polymer (A) containing the polymer units ($a^1$) derived from an unsaturated ester containing a polyfluroalkyl group and the polymer units ($b^1$) derived from a compound containing a silicon atom and an unsaturated group, and an aqueous medium (B), further optionally including a fluorine type surfactant (c).

21 Claims, No Drawings

COMPOSITION FOR PREVENTING CREEPING OF A FLUX FOR SOLDERING AND USE THEREOF

TECHNICAL FIELD

The present invention relates to a composition to be used for pretreatment for soldering an electronic part having electric contact points or a printed board having electric contact points, which prevents creeping of a flux for soldering. Further, the present invention relates to a method for soldering by means of such a composition, an electronic part or printed board obtained by such a method, and further an electric appliance.

BACKGROUND ART

When various parts are soldered to a printed board, or IC is soldered to an IC socket, it is common to preliminarily treat the printed board with a flux in order to improve the adhesion of the solder. Usually, a flux contains an acidic component and thus is corrosive. Accordingly, it is necessary to prevent adhesion or penetration of a flux at an electric contact portion of an electronic part such as a connector, a switch, a volume or a pre-set resistor or at a portion where no soldering is required in a printed board. Especially in a case of an electronic part, soldering is frequently carried out at a through-hole portion. A phenomenon such that a flux creeps such a through-hole portion by e.g. a capillary phenomenon and penetrates or deposits at an unnecessary portion of the electronic part, is called "creeping of a flux", and it is necessary to prevent such a phenomenon.

For the purpose of preventing penetration or deposition of the flux mentioned above, an agent for preventing creeping of a flux is used. As agents for preventing creeping of a flux for soldering, the following examples are known.

(1) A composition containing a compound having a polyfluoroalkyl group or a polymer thereof, and an organic solvent (JP-A-60-49859). Such a organic solvent may be a hydrocarbon type solvent such as heptane, an ester type solvent such as ethyl acetate, a chlorofluorocarbon (CFC) such as 1,1,2-trichloro-1,2,2-trifluoroethane (CFC-113), or a perfluorocarbon (PFC) having a boiling point of from 60 to 120° C., or a fluorine-containing aromatic hydrocarbon type solvent such as 1,3-bis(trifluoromethyl)benzene.

(2) A composition having a low molecular compound containing polyfluoroalkyl groups or a polymer containing polyfluoroalkyl groups, dissolved in an alcohol solvent such as ethanol.

(3) A composition having a fluorine polymer obtained by polymerizing tetrafluoroethylene, a perfluoro(alkylvinyl ether) or vinylidene fluoride, a surfactant and an extender, dispersed in water (JP-A-5-175642).

(4) A composition containing a polymer of an unsaturated ester having a polyfluoro group, a fluorine-containing type surfactant and aqueous medium (JP-A-11-154783).

However, conventional agents for preventing creeping of a flux for soldering, have the following problems.

The composition (1) requires a due care, since the organic solvent is inflammable, and further, it has a problem from the viewpoint of the working environment, since it contains a volatile solvent. Further, when the solvent is a hydrocarbon type solvent, there will be problem that the solubility of the fluorine-containing component in the composition is poor. Further, with respect to CFC among the solvents, its influence over the ozone layer is feared, and its use is restricted by regulations relating to fluorocarbons. HCFC-225 or HCFC-141b, as a substitute for CFC, has similar problems. Further, PFC, a fluorine-containing type solvent, has a high coefficient for warming up the earth, and its influence over the environment is feared. The fluorine-containing aromatic hydrocarbon type solvent is inflammable and has a problem of odor.

The composition (2) is required to have the fluorine content of the low molecular weight compound or the polymer containing polyfluoro alkyl groups lowered in order to increase the solubility of such a compound or a polymer in the alcohol solvent. Further, the effect for preventing creeping of a flux is inadequate.

The fluorine polymer in the composition (3) is non-adhesive and poor in wettability and adhesion to the surface of an electronic part as a substrate. Accordingly, it is practically required to add a spreader. Further, this fluorine polymer has a softening point higher than 150° C., and heat treatment at a high temperature of at least the above softening point is required in order to form a film by drying the fluorine polymer particles deposited on a substrate by means of a spreader. The temperature for this heat treatment will be often higher than the heat resistant temperatures of the plastic portions incorporated into electronic parts, and practically, there is a problem that such heat treatment can not be done. On the other hand, if no heat treatment is applied, white fluorine polymer particles are likely to deposit as white solid on electronic parts, and there will be a drawback that the gloss of the treated surface for creeping of a flux is impaired.

In the composition (4), the polymer containing polyfluoro groups is still insufficient in its adhesion, although it is improved as compared with the fluorine polymer particles in the composition (3). Thus the satisfactory adhesion to the surface of an electronic part is not obtained. Further, the hardness of surface of the film obtained from the composition is also insufficient so that the surface tends to be scratched during the working operation, and there will be problem that a flux will be deposited on the scratched parts of the surface.

DISCLOSURE OF THE INVENTION

The present invention has been made to solve the above problems and provides a composition for preventing creeping of a flux for soldering, which comprises a polymer (A) containing the following polymer units ($a^1$), and the following polymer units ($b^1$), and an aqueous medium (B).

Polymer units ($a^1$): Polymer units derived from an unsaturated ester containing a polyfluoroalkyl group, or polymer units derived from an unsaturated ester containing a polyfluoroalkyl group having an etheric oxygen atom inserted in the carbon-carbon bond.

Polymer units ($b^1$): Polymer units derived from a compound containing a silicon atom and an unsaturated group.

The preferred embodiment in the present invention, the polymer unit ($a^1$) is a polymer unit of the compound having the following formula (1).

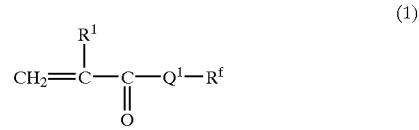

In the formula (1), $Q^1$, $R^1$ and $R^f$ are defined as follows:

$Q^1$: a single bond or a bivalent connecting group.

$R^1$: a hydrogen atom or a methyl group.

$R^f$: a polyfluoroalkyl group or a polyfluoroalkyl group having an etheric oxygen atom inserted in the carbon-carbon bond.

The preferred embodiment in the present invention, the polymer unit (b¹) is a polymer unit of the compound having the following formula (2).

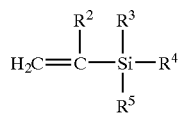
(2)

In the formula (2), $R^2$, $R^3$, $R^4$, and $R^5$ are defined as follows:
$R^2$: a hydrogen atom or a methyl group.
$R^3$, $R^4$ and $R^5$: independently from one another an alkyl group having a carbon number of from 1 to 5, or an alkoxy group having a carbon number of from 1 to 5.

The preferred embodiment in the present invention, the composition is one containing a fluorine type surfactant (C).

The preferred embodiment in the present invention, the softening point of the polymer (A) is at least 40° C. and less than 150° C.

The preferred embodiment in the present invention, the aqueous medium (B) is a water soluble organic solvent having a boiling point of from 40 to 200° C.

The preferred embodiment in the present invention, the surface tension is from 10 to 25 mN/m.

The present invention also provides a method for soldering an electronic part or printed board, which comprises forming a coating film of any one of compositions mentioned above on a part of or the while surface of an electronic part or a printed board, then treating the surface having the coating film thus formed, with a flux for soldering, and then carrying out soldering.

Further, the present invention provides an electronic part or printed board having a property of preventing creeping of a flux for soldering, obtained by forming a coating film of any one of compositions mentioned above on the surface thereof.

Further, the present invention provides an electric appliance employing the electronic part or printed board.

BEST MODE FOR CARRYING OUT THE INVENTION

In the present invention, the polymer (A) is a polymer containing the particular constituting units ie, the polymer units (a¹) and the polymer units (b¹).

In the following, a polyfluoroalkyl group and a polyfluoroalkyl group having an etheric oxygen atom inserted in the carbon-carbon bond, will be generally referred to as a "$R^f$ group". An alkyl group and an alkyl group having an etheric oxygen atom inserted in the carbon-carbon bond, will be generally referred to as an "alkyl group which may contain an etheric oxygen atom". An acrylate and a methacrylate will be generally referred to as a (meth)acrylate, and the same applies to other (methacrylic acid, etc.

The polymer units (a¹) are polymer units derived from an unsaturated ester containing a $R^f$ group.

The $R^f$ group is meant for a group having at least two hydrogen atoms of an alkyl group which may contain an etheric oxygen atom, substituted by fluorine atoms. The number of fluorine atoms in the $R^f$ group is preferably at least 60%, particularly preferably at least 80%, when it is represented by [(the number of fluorine atoms in the $R^f$ group)/(the number of hydrogen atoms contained in the alkyl group which may contain an etheric oxygen atom, having a structure corresponding to the $R^f$ group)]×100%.

Further, as the $R^f$ group having an etheric oxygen atom, a $R^f$ group containing an oxypolyfluoroalkylene moiety of e.g. oxypolyfluoroethylene or oxypolyfluoropropylene, may be mentioned.

The carbon number of the $R^f$ group is preferably from 4 to 14, particularly preferably from 6 to 12. The $R^f$ group may be of a straight chain structure or a branched structure, preferably of a straight chain structure. When it is of a branched structure, it is preferred that the branched moiety is present at a terminal portion of the $R^f$ group and is a short chain with from 1 to 3 carbon atoms. Further, the $R^f$ group may have a chlorine atom at the terminal portion. As the structure of the terminal portion of the $R^f$ group, a structure such as $CF_3CF_2—$, $CF_2H—$, $CF_2Cl—$ or $(CF_3)_2CF—$ may be mentioned.

The $R^f$ group in the present invention is preferably a perfluoroalkyl group (hereinafter referred to as a $R^F$ group) which may contain an etheric oxygen atom, having substantially all hydrogen atoms of an alkyl group which may contain an etheric oxygen atom, substituted by fluorine atoms The carbon number of the $R^F$ group is preferably from 4 to 14, particularly preferably from 6 to 12. Further, the $R^F$ group may be of a straight chain a structure or a branched structure, preferably a group of a straight chain structure.

The $R^F$ group is preferably a group having substantially all hydrogen atoms of an alkyl group substituted by fluorine atoms (i.e. a group containing no etheric oxygen atom), particularly preferably a straight chain group represented by $F(CF_2)_n—$ [wherein n is an integer of from 6 to 12].

Specific examples of the $R^f$ group include the following structures, but are not limited thereto. Further, in the following specific examples, groups corresponding to structurally isomeric groups, are included.

Examples of the $R^f$ group containing no etheric oxygen atom.

$C_2F_5—$, $C_3F_7—$ [including both $F(CF_2)_3—$ and $(CF_3)_2CF—$], $C_4F_9—$ [including $F(CF_2)_4—$, $(CF_3)_2CFCF_2—$, $(CF_3)_3C—$ and $F(CF_2)_2CF(CF_3)—$], $C_5F_{11}—$ [including structurally isomeric groups such as $F(CF_2)_5—$, $(CF_3)_2CF(CF_2)_2—$, $(CF_3)_3CCF_2—$, and $F(CF_2)_2CF(CF_3)CF_2—$], $C_6F_{13}—$ [including structurally isomeric groups such as $F(CF_2)_3C(CF_3)_2—$], $C_8F_{17}—$, $C_{10}F_{21}—$, $C_{12}F_{25}—$, $C_{15}F_{31}—$, $HC_tF_{2t}—$ (wherein t is an integer of from 1 to 18), $(CF_3)_2CFC_sF_{2s}—$ (wherein s is an integer of from 1 to 15). etc.

Examples of the $R^f$ group containing an etheric oxygen atom.

$F(CF_2)_5OCF(CF_3)—$, $F[CF(CF_3)CF_2O]_sCF(CF_3)CF_2CF_2—$, $F[CF(CF_3)CF_2O]_tCF(CF_3)—$, $F[CF(CF_3)CF_2O]_uCF_2CF_2—$, $F(CF_2CF_2CF_2O)_vCF_2CF_2—$, $F(CF_2CF_2O)_wF_2CF_2—$ (wherein s and t are independently an integer of from 1 to 10, preferably an integer of from 1 to 3, u is an integer of from 2 to 6, v is an integer of from 1 to 11, preferably an integer of from 1 to 4, and w is an integer of from 1 to 11, preferably an integer of from 1 to 6), etc.

The polymer units (a¹) in the present invention are preferably polymer units derived from a $R^f$ group-containing (meth)acrylate represented by the following formula (1).

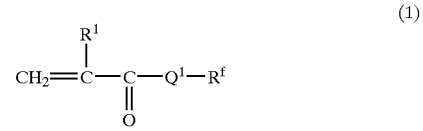
(1)

The symbols in the formula (1) have the following meanings.
$Q^1$: A single bond or a bivalent connecting group.
$R^1$: A hydrogen atom or a methyl group.
$R^f$: $R^f$ group.

$Q^1$ in the group is preferably a bivalent organic connecting group, particularly preferably those mentioned in the following specific examples. $R^f$ in the formula is preferably a polyfluoroalkyl group containing no etheric oxygen atom, particularly preferably a perfluoroalkyl group containing no etheric oxygen atom. The following compounds may be mentioned as specific examples of the $R^f$ group-containing (meth)acrylate represented by the formula (1).

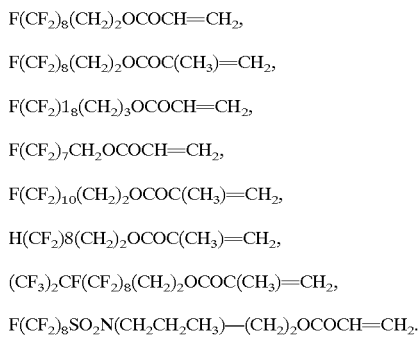

$F(CF_2)_8(CH_2)_2OCOCH=CH_2,$ $F(CF_2)_8(CH_2)_2OCOC(CH_3)=CH_2,$ $F(CF_2)1_8(CH_2)_3OCOCH=CH_2,$ $F(CF_2)_7CH_2OCOCH=CH_2,$ $F(CF_2)_{10}(CH_2)_2OCOC(CH_3)=CH_2,$ $H(CF_2)8(CH_2)_2OCOC(CH_3)=CH_2,$ $(CF_3)_2CF(CF_2)_8(CH_2)_2OCOC(CH_3)=CH_2,$ $F(CF_2)_8SO_2N(CH_2CH_2CH_3)-(CH_2)_2OCOCH=CH_2.$

Polymer units ($a^1$) in the polymer (A) may be of one type only, or of two or more types. In the case of two or more types, they are preferably polymer units derived from two or more monomers having different carbon numbers in the $R^f$ group portions.

The polymer units ($b^1$) are polymer units derived from the compound containing a silicon atom and an unsaturated group. The compound containing a silicon atom and an unsaturated group is preferably a compound represented by the following formula (2).

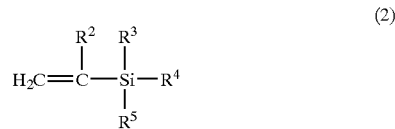

(2)

In the formula (2), $R^2$, $R^3$, $R^4$, and $R^5$ have the following meanings:

$R^2$: a hydrogen atom or a methyl group.

$R^3$, $R^4$ and $R^5$: independently an alkyl group having a carbon number of from 1 to 5, preferably from 1 to 3, or an alkoxy group having a carbon number of from 1 to 5, preferably from 1 to 3.

$R^3$, $R^4$ and $R^5$ may be the same group or a different group from one another, and at least one of which is preferably an alkoxy group since the solubility to an aqueous medium is enhanced.

As a specific example of the compound represented by the formula (2) are mentioned the following compounds.

$CH_2=CHSi(OCH_3)_3$ $CH_2=CHSi(OC_2H_5)_3$ $CH_2=CHSi(CH3)(OCH_3)_2$ $CH_2=CHSi(CH_3)(OC_2H_5)_2$ $CH_2=CHSi(OC_3H_7)_3$ $CH_2=C(CH_3)Si(OCH_3)_3$ $CH_2=C(CH)Si(OC_2H_5)_3$

The polymer units ($b^1$) in the polymer (A) may be of one type only or of two or more types.

In order that the coating film obtained from the composition containing the polymer (A) has sufficient scratch resistance and stripping resistance, the amount of the polymer units ($b^1$) in the polymer (A) is preferably from 0.1 to 50 wt %, particularly preferably from 1 to 30 wt %.

The polymer (A) may contain polymer units ($c^1$) other than the polymer units ($a^1$) and the polymer units (b2). Such polymer units ($c^1$) is not particularly limited, so long as they are polymer units derived from a monomer (hereinafter referred to as other monomer) containing a polymerizable unsaturated group, no $R^f$ group and no silicon atom. Such other monomer may be employed from known or well known compounds, and one or more of them may be used. It is preferred to employ a polymer (A) containing polymer units ($c^1$) derived from other monomer, since the leveling property will be improved, and the uniformity of the coating film will also be improved.

The polymer units ($c^1$) are preferably selected from polymer units derived from polyolefin type unsaturated esters such as acrylic acid esters, unsaturated esters having epoxy groups, compounds having vinyl groups, and compounds having substituted or unsubstituted amino groups and polymerizable unsaturated groups.

As the polymer units ($c^1$), particularly preferred are polymer units derived from at least one monomer selected from the group of ethylene, vinyl chloride, stylene, (meth) acrylic acid, cyclohexyl(meth)acrylate, an alkyl (meth) acrylate, a mono(meth)acrylate of a polyoxyalkylene diol and glycidyl(meth)acrylate. The polymer units ($c^1$) derived from at least one monomer selected from cyclohexyl(meth) acrylate and an alkyl (meth)acrylate containing the alkyl group having more than 6 (?) carbon numbers are exceptionally preferred, since the leveling property of the composition of the present invention will be improved.

As a specific polymer (A) containing the polymer units ($a^1$) and the polymer units ($b^1$) in the present invention, is preferred a polymer (A) which contains polymer units ($a^1$) derived from $R^f$—OCOCH=$CH_2$ ($R^f$ is as defined above) and polymer units ($b^1$) derived from $CH_2$=CHSi(OR$^6$)$_3$ ($R^6$ is an alkyl group having a carbon number of 1 to 3).

Further, as a specific polymer (A) optionally including polymer units ($c^1$), is preferred a polymer (A) which contains polymer units ($a^1$) derived from $R^f$—OCOCH=$CH_2$, polymer units (b2) derived from $CH_2$=CHSi(OR$^6$)$_3$ and polymer units ($c^1$) derived from cyclohexyl (meth)acrylate, since the leveling property, the uniformity of the film, etc will be extremely excellent.

The fluorine content in the polymer (A) is preferably at least 30 wt %, particularly preferably at least 45 wt %, most preferably from 45 to 80 wt %. If the fluorine content is less than 30 wt %, the critical surface tension of the surface of the coating film formed after the treatment tends to be high, whereby no adequate performance for preventing creeping of a flux, tends to be obtained.

The weight-average molecular weight of the polymer (A) is preferably from $1\times10^3$ to $1\times10^7$, particularly preferably from $1\times10^4$ to $1\times10^5$, most preferably from $2\times10^4$ to $5\times10^4$. Further, when the polymer (A) is a polymer containing at least two types of polymerizable units, the arrangement of the respective polymer units may be block or random, particularly preferably random.

The composition of the present invention contains and an aqueous medium (B) together with the polymer (A). The polymer (A) in the composition is preferably dispersed in the form of particles in the after-described aqueous medium. The particle size of particles dispersed in the composition is preferably from 0.01 to 1 $\mu$m. The concentration of the polymer (A) in the composition of the present invention is preferably from 0.01 to 3 wt %, particularly preferably from 0.03 to 1 wt %. If the concentration of the polymer (A) is less than 0.01 wt %, no adequate effect for preventing creeping of a flux tends to be obtained, and if the concentration is higher than 3 wt %, the coating film of the polymer (A) to be formed at the time of treatment, tends to be so thick that the solder is likely to be hardly attached.

The composition of the present invention contains the above polymer (A) as an essential component When the composition is to be treated by a usual flux-treating method, the composition is applied to the surface of an electronic part and then dried to soften the polymer (A) to form a uniform coating film.

For the composition of the present invention to be widely used, the softening point of the polymer (A) is preferably low. The heat resistant temperatures of plastics to be used for electronic parts, are about 150° C. in most cases, and the softening point of the polymer (A) is accordingly preferably lower than 150° C. Further, taking also the drying efficiency into consideration, the softening point of the polymer (A) is preferably at least 40° C. and less than 150° C., particularly preferably from 80 to 120° C.

In the present invention, the surface tension of the composition can be adjusted to from 10 to 25 mN/m (20 to 30° C.) by incorporating the above polymer (A) and the fluorine type surfactant (C) in combination to the composition. Usual surface tension of an aqueous dispersion of the polymer (A) containing no fluorine type surfactant (C), is at a level of from 40 to 70 mN/m (20 to 30° C.). On the other hand, the critical surface tension of a substrate to which the composition of the present invention can be applied, usually becomes at a level of from 25 to 40 mN/m. Accordingly, the surface tension of the composition of the present invention containing the fluorine type surfactant (C) becomes lower than the surface tension of the substrate, and thus, it is excellent in wettability or adhesion to the substrate and exhibits a performance for preventing creeping of a flux.

As the fluorine type surfactant (C), an ionic surfactant having fluorine atoms, or a nonionic surfactant having fluorine atoms, may be mentioned.

Further, the fluorine type surfactant (C) may be any one of an anionic fluorine type surfactant having $R^f$ groups and anionic groups in combination, a cationic fluorine type surfactant having $R^f$ groups and cationic groups in combination, an amphoteric surfactant having $R^f$ groups and cationic and anionic groups in combination, and a nonionic surfactant having $R^f$ groups and hydrophilic groups in combination.

As tradenames of fluorine type cationic surfactants, "Surflon S-121", manufactured by Seimi Chemical Company Ltd., "Fluorade FC-134", manufactured by 3M Co. and "Megafac F-150", manufactured by Dainippon Ink & Chemicals Inc., may be mentioned.

As tradenames of fluorine type anionic surfactants, "Surflon S-111", manufactured by Seimi Chemical Company Ltd., "Fluorade FC-143", manufactured by 3M Co. and "Megafac F-120", manufactured by Dainippon Ink & Chemicals Inc., may be mentioned.

As tradenames of fluorine type amphoteric surfactants, "Surflon S-132", manufactured by Seimi Chemical Company Ltd., "Fluorade FX-172", manufactured by 3M Co. and "Megafac F-120", manufactured by Dainippon Ink & Chemicals Inc., may be mentioned.

As tradenames of fluorine type nonionic surfactants, "Surflon S-145", manufactured by Seimi Chemical Company Ltd, "Fluorade FC-170", manufactured by 3M Co. and "Megafac F-141", manufactured by Dainippon Ink & Chemicals Inc., may be mentioned.

Further, a polymer having a $R^f$ group which is capable of lowering surface tension may be used as a fluorine type surfactant, and "Surflon S-381", manufactured by Seimi Chemical Company Ltd. is mentioned as an example. Such polymer tends to act as a kind of a binder, whereby the strength of the coating film will be improved.

The amount of the fluorine type surfactant (C) is preferably from 20 to 2,000 ppm, particularly preferably from 100 to 1,000 ppm, in the composition. If the amount of the fluorine type surfactant (C) is made at least 20 ppm, the wettability of the composition to a substrate and the performance for preventing creeping of a flux, can be improved. On the other hand, by adjusting it to at most 2,000 ppm, the critical surface tension of the formed coating film tends to be low, and an adequate performance for preventing creeping of a flux can be obtained.

When the fluorine type surfactant (C) is used in a large amount, the fluorine type surfactant (C) tends to remain on the surface of the coating film, whereby the critical surface tension tends to be high, and the desired performance may not be obtained. In such a case, the treated substrate may be rinsed with water to remove the surfactant on the coating film surface. However, two additional steps of rinsing and redrying will then be required, such being undesirable.

Further, the composition of the present invention contains an aqueous medium (B). As the aqueous medium (B), water, or one having a water-soluble organic solvent incorporated to water, may be mentioned. As the water-soluble organic solvent, a ketone, an ester, a glycol, a glycol ether or an alcohol may, for example, be mentioned. When the aqueous medium (B) contains a water-soluble organic solvent, the proportion of water in the aqueous medium (B) is preferably from 50 to 95 wt %, while the proportion of the water-soluble organic solvent is preferably from 5 to 50 wt %.

Further, the water-soluble organic solvent is preferably one having a boiling point of from 40 to 200° C., from the viewpoint of drying efficiency. Further, the water-soluble organic solvent is preferably an organic solvent which has a solubility in water at 20° C. of at least 1 wt %. Further, the amount of the water-soluble organic solvent in the composition is preferably from 5 to 50 wt %, particularly preferably from 10 to 30 wt %.

The method for preparing the polymer (A) of the present invention is not particularly limited. When it is synthesized by an emulsion polymerization method, the composition of the present invention may directly be obtained, such being preferred. When the emulsion polymerization is carried out, it is preferably carried out by the following method 1 or 2.

Method 1: A method which comprises emulsifying a monomer in the presence of a medium and an emulsifier, followed by polymerization with stirring.

Method 2: A method which comprises emulsifying a monomer in the presence of a medium and an emulsifier by a homomixer or high pressure emulsifying apparatus, prior to addition of a polymerization initiator, and then reacting a polymerization initiating source for polymerization.

In either one of the above methods, when a monomer of gas state such as vinyl chloride is employed as the monomer, it may be continuously supplied under pressure by means of a pressure container. The polymerization initiating source is not particularly limited, and a usual polymerization initiator such as an organic peroxide, an azo compound or a persulfate, or ionizing radiation rays such as γ-rays, may, for example, be employed. As the medium, the same as the aqueous medium (B) may preferably be employed.

Namely, when the composition of the present invention is prepared by an emulsion polymerization method, it is preferred to employ a method wherein the compound represented by the formula (1) and other monomers, as the case requires, are emulsion-polymerized in the presence of an emulsifier in an aqueous medium (B).

Further, in all of the above-mentioned methods, the emulsifier may be the fluorine type surfactant (C) or the non-fluorine type surfactant. It is preferred to employ the non-fluorine type surfactant ($B^2$), since it is excellent in the emulsifying activity.

The composition of the present invention preferably contains the non-fluorine type surfactant. Accordingly, it is preferred to prepare it by adding the fluorine type surfactant (C) without removing the non-fluorine type surfactant after the emulsion polymerization.

As the non-fluorine type surfactant, a non-fluorine type non-ionic surfactant having a HLB value of at least 7, a non-fluorine type cationic surfactant having an alkyl group of at least 6 carbon atoms in its molecule, or a non-fluorine type anionic surfactant having an alkyl group having at least 6 carbon atoms in its molecule, is preferred.

As the non-fluorine type non-ionic surfactant having a HLB value of at least 7, a known nonionic surfactant having at least 5 oxyalkylene units in its molecule, is preferred. As the oxyalkylene units, oxyethylene or oxypropylene is preferred. Further, as the non-fluorine type cationic surfactant having an alkyl group of at least 6 carbon atoms in its molecule, an alkyl ammonium salt may, for example, be mentioned, and as the non-fluorine type anionic surfactant having an alkyl group of at least 6 carbon atoms in its molecule, an alkyl sulfate may, for example, be mentioned.

Now, specific examples of the non-fluorine type surfactant in the present invention will be given below.

Polyoxyethylene lauryl ether (HLB=14.5, oxyethylene addition mols=9), polyoxyethylene polyoxypropylene cetyl ether (HLB=9.5, oxyethylene addition mols=1, oxypropylene addition mols=8), polyoxyethyleneoctylphenyl ether (HLB=11.5, oxyethylene addition mols=10), polyoxyoxyethylenenonylphenyl ether (HLB=8.0, oxyethylene addition mols=5), stearyl trimethylammonium chloride, dioctyldimethylammonium chloride, lauryl ammonium sulfate, polyoxyethylenelauryl ether sodium sulfate, dimethyloctyldecylamine acetate.

Among these, preferred as the non-fluorine type surfactant ($B^2$), is, for example, polyoxyethylenelauryl ether, polyoxyethyleneoctylphenyl ether, polyoxyethylenenonylphenyl ether, or dimethyloctyldecylamine acetate.

Further, when a surfactant is used during the emulsion polymerization, either of the fluorine type surfactant (C) or the non-fluorine type surfactant may be used, or at least two surfactants having different ionic natures may be used in combination. However, when surfactants having different ionic natures, are used, it is preferred to combine cationic and non-cationic surfactants, anionic and nonanionic surfactants, or nonionic and amphoteric surfactants.

The composition of the present invention preferably C) contains the non-fluorine type surfactant together with the fluorine type surfactant (C), and the amount of the non-fluorine type surfactant is preferably from 50 to 80 wt %, based on the total amount of the fluorine-type surfactant (C) and the non-fluorine type surfactant. The non-fluorine type surfactant may be the one used in the emulsion polymerization or may be added after the polymerization.

Further, the polymer (A) may be obtained by a solution-polymerization using a fluorine-containing solvent. As the fluorine-containing solvent, HFC such as 1,3-bis (trifluoromethyl)benzene or 2,3-dihydrodecafluoro-(n-)pentane, or HCFC such as $C_3HF_5Cl_2$ ("AK-225", tradename, manufactured by Asahi Glass Company Ltd.), may be mentioned. It is preferred that such a fluorine-containing solvent is removed after the polymerization, and the polymer (A) is dispersed in the aqueous medium (B) in the presence of the fluorine type surfactant (C) to obtain the composition of the present invention.

The composition of the present invention is diluted to an optional concentration depending upon the purpose and the application, and then coated to a substrate. As the coating method, a common method for coating may be employed. For example, a method such as dip coating, spray coating or coating by an aerosol can having the composition of the present invention packed therein, may be mentioned.

As the substrate, an electronic part having an electric contact, such as a connector, a switch, a volume or a pre-set resistor, or a printed board having an electric contact, may be mentioned. As the portion treated by the composition of the present invention, a portion may be mentioned where creeping of a flux is likely to take place during soldering of an electronic part such as a connector to a printed board. More specifically, a basal portion of an electronic part such as a connector, to be attached to a printed board, a board surface on the side of the printed board on which the electronic part is Lo be mounted, or a through-hole provided in a printed board to attach an electronic part, may, for example, be mentioned.

By the coating with the composition of the present invention, it is possible to prevent deposition of a flux for soldering at an unnecessary portion.

Further, the composition of the present invention provides a merit such that even when deposited at the contact portion, it does not impair the electric characteristics (such as electrical conductivity, etc.) or the outer appearance of the part. Accordingly, it may be applied over the entire surface of the electronic part or the printed board, and a treating method other than as described above, may be employed. For example, a treating method by total dipping or semi dipping with good treating efficiency, may be employed and preferred.

When the composition of the present invention is applied by total dipping, there is the optimum concentration of the polymer (A) for every type of the electronic part as the substrate. Each optimum concentration is shown in Table 1.

TABLE 1

| Type of the part | Optimum concentration range of polymer (A) |
| --- | --- |
| Switch | 0.03 to 0.3 wt % |
| Volume | 0.03 to 0.3 wt % |
| Pre-set resistor | 0.03 to 0.3 wt % |
| Connector | 0.05 to 1.0 wt % |
| Printed board | 0.20 to 1.0 wt % |

The reason why the optimum concentration for every type of the parts is present is as follows. Namely, when the composition is applied by total dipping, the composition will deposit not only at the desired portion (such as only the lead wire portion) but also at other portions, to form a coating film. On the other hand, with the electronic part to be a substrate, the contact load of the electric contact required for electrical conduction is different depending upon the type or the shape. Such difference in the contact load brings about the difference in spalling strength of the coating film. Accordingly, by adjusting the concentration of the composition of the present invention to the contact load, the thickness of the coating film can be modified.

Further, in the semi dipping method wherein only an electronic part which requires the coating film, is dipped in the composition of the present invention, the optimum concentration range of the polymer (A) for the electronic part is preferably at most 3 wt % in the composition, particularly preferably from 0.01 to 0.3 wt %, with respect to any electronic part.

The composition of the present invention is coated to a part of or whole surface of an electronic part or a printed board to be soldered, followed by drying to form a coating film on the surface. After the coating, it is dried and preferably further subjected to curing. By the curing, it is possible to form a more uniform coating film on the surface of the substrate. The curing temperature is preferably a temperature exceeding the softening point of the polymer (A).

The composition of the present invention may contain other additives within a range not to adversely affect the dispersion stability of the polymer (A), the effect for preventing creeping of a flux, the insulating property for the outer appearance. As such other additives, a pH controlling agent to prevent corrosion, a rust-preventing agent, a dye for sensing the concentration of the polymer in liquid, a stabilizer for the dye, a flame retardant, and an antistatic agent, may, for example, be mentioned.

The composition of the present invention serves to form a coating film on the surface of an electronic part or a printed board and to prevent creeping of a flux for soldering. And, an electronic part or a printed substrate, having corrosion by a flux prevented, will be presented.

The electronic part or the printed board, having a coating film formed on the surface by drying the composition of the present invention, will then be treated with a flux for soldering, followed by soldering, whereby a soldered electronic part or printed board will be presented. And, such an electronic part or printed board will be used for various electric appliances. Such electric appliances will be electric appliances with excellent quality, having a trouble to be caused by corrosion by a flux prevented.

Specific examples of such electric appliances include equipments for computers, televisions, audio equipments (radio cassettes, compact discs, mini discs), portable telephones, etc.

The mechanism for the excellent performance of the composition of the present invention is not clearly understood, but is assumed to be as follows. Namely, the softening point of the polymer (A) in the composition is properly adjusted, whereby the coating film will conform to plastic portions of the electronic parts etc. This will improve the adhesion of the film to the above portions and the stripping resistance. Further, during the drying of the composition, the $R^1$ groups in the polymer (A) will align regularly on the film surface to enhance the elimination of the flux efficiently.

EXAMPLES

Now, the present invention will be described in detail, but the present invention is not limited thereto.

Here, the molecular weight is a value measured by a gel permeation chromatography (GPC) and calculated as polystyrene. The softening point is a value measured by a Durrans mercury method.

Example 1

Preparation Example of Polymer A

Into a 1 liter autoclave made of glass, 147 g of $F(CF_2)_8(CH_2)_2OCOCH=CH_2$, 21 g of vinyltrimethoxysilane, 42 g of cyclohexyl methacrylate, 21 g of polyoxyethyleneoctylphenyl ether (oxyethylene addition mols=10, HLB=11.5), 1 g of dodecylmercaptan, 52 g of acetone and 365 g of deionized water, were added, and pre-emulsification was carried out at 50° C. for 1 hour. Then, 2 g of 2,2'-azobis(2-methylpropionamidine) hydrochloride was added, and the autoclave was flushed with nitrogen.

The temperature was raised to 60° C. with stirring, and polymerization was carried out for 15 hours. After cooling, the emulsion polymerization solution was obtained. The analysis of the solution was made by gas chromatography (GC), whereby the conversions of $F(CF_2)_8(CH_2)_2OCOCH=CH_2$ vinyltrimethoxysilane and cyclohexyl methacrylate were at least 99%, and thus, the polymerization reaction was found to have proceeded satisfactorily. Then, filtration was carried out by means of a filter with a pore diameter of 6 μm to obtain a milky white emulsion. The solid content concentration of the emulsion was 30 wt %, and the particle size of dispersed particles was 0.4 μm. Further, the weight-average molecular weight of the polymer was $3\times10^4$, the softening point was 130° C., and the fluorine content was 41 wt %.

Example 2

Preparation Example of Polymer A

A polymerization reaction was carried out under the same conditions as in Example 1 except that cyclohexyl methacrylate was changed to behenyl methacrylate. After cooling, the analysis was carried out by GC whereby the conversions of $F(CF_2)_8(CH_2)_2OCOCH=CH_2$, vinylmethoxysilane and behenyl methacrylate were at least 99%, and thus the polymerization reaction was found to have proceeded satisfactorily. Then, filtration was carried out by means of a filter with a pore diameter of 6 μm to obtain a milky white emulsion. The solid content concentration of the emulsion was 34 wt %, and the particle size of the dispersed particles was 0.3 μm. Further, the weight-average molecular weight of the copolymer was $2\times10^4$, the softening point was 100° C., and the fluorine content was 40 wt %.

Example 3

Preparation Example of Polymer A

A polymerization reaction was carried out under the same conditions as in Example 1 except that cyclohexyl methacrylate was changed to $CH_2=C(CH_3)COO(CH_2CH_2O)_4H$, and polyoxyethyleneoctylphenyl ether was changed to dimethyloctadecylamine acetate. After cooling, the analysis was carried out by GC, whereby the conversions of all of $F(CF_2)_8(CH_2)_2OCCH=CH_2$ vinylmethoxysilane and $CH_2=C(CH_3)COO(CH_2CH_2O)_4H$ were at least 99%, and thus, the polymerization reaction was found to have proceeded satisfactorily. Then, filtration was carried out by means of a filter with a pore diameter of 6 μm to obtain a milky white emulsion. The solid content concentration of the emulsion was 32 wt %, and the particle size of the dispersed particles was 0.2 μm. Further, the weight-average molecular weight of the copolymer was $2\times10^4$, the softening point was 110° C., and the fluorine content was 48 wt %.

Example 4

Preparation Example of Polymer A

Into a 1 liter autoclave made of glass, 167 g of $CF_3(CF_2)_7(CH_2)_2OCOCH=CH_2$, 42 g of vinyldimethoxysilane, and 21 g of polyoxyethyleneoctylphenyl ether (oxyethylene addition mols=10, HLB=11.5), 1 g of dodecylmercaptan, 52 g of acetone, and 365 g of deionized water, were added, and pre-emulsification was carried out at 50° C. for 1 hour. Then, 2 g of azobis(methylpropionamidine) hydrochloride was added, and the autoclave was flushed with nitrogen. The temperature was raised to 60° C. with stirring, and polymerization was carried out for 15 hours. After cooling, the GC analysis was carried out, whereby the conversions of both $CF_3(CF_2)_7(CH_2)_2OCOCH=CH_2$ and vinyldimethoxysilane were at least 99%, and thus, the polymerization reaction was found to have proceeded satisfactorily. Then, filtration was carried out by means of a filter with a pore diameter of 6 μm to obtain a milky white emulsion. The solid content concentration of the emulsion was 34%, and the particle size of the dispersed particles was 0.1 μm. Further, the weight-average molecular weight of the copolymer was $3 \times 10^4$, and the softening point was 110° C.

Example 5

Preparation Example of a Comparative Polymer

Into a 1 liter beaker made of glass, 20 g of a tetrafluoroethylene resin having an weight-average molecular weight of $1 \times 10^4$ and a softening point of at least 200° C., 10 g of casein calcium as an spreader, 3 g of polyoxyethyleneoctylphenyl ether (oxyethylene addition mols=10, HLB=11.5), and 80 g of deionized water, were added, and emulsification was carried out at 50° C. for 1 hour, to obtain a white emulsion having a solid content concentration of 33% and a particle size of 0.5 μm.

Example 6

Preparation Example of a Comparative Polymer

A polymerization reaction was carried out under the same conditions as in Example 1 except that the monomers were changed to 168 g of $F(CF_2)_8(CH_2)_2CH=CH_2$ and 42 g of cyclohexyl methacrylate. After cooling, the analysis was carried out by GC, whereby the conversions of both $F(CF_2)_8(CH_2)_2CH=CH$ and cyclohexyl methacrylate were at least 99%, and thus, the polymerization reaction was found to have proceeded satisfactorily.

Then, filtration was carried out by means of a filter with a pore diameter of 6 μm to obtain a milky white emulsion. The solid content concentration of the emulsion was 32 wt %, and the particle size of the dispersed particles was 0.4 μm. Further, the weight-average molecular weight of the copolymer was $2 \times 10^4$, the softening point was 120° C., and the fluorine content was 48 wt %.

Preparation of Compositions 1 to 9

To the emulsions prepared in Examples 1 to 6, fluorine type surfactant compositions of the types and amounts (unit: wt %) as identified in Table 2, and deionized water were blended to obtain compositions 1 to 9 having a polymer (A) concentration of 1 wt %. Here, compositions 8 and 9 are comparative compositions.

Here, Surflon S-145 is a composition comprising water and a fluorine type nonionic surfactant (30 wt %). Surflon S-121 is a composition comprising water and a fluorine type cationic surfactant (30 wt %). Surflon S-38 is a composition comprising a polymer having $R^f$ group (70 wt %).

TABLE 2

| Composition | Emulsion Type | Emulsion Amount | Fluorine type surfactant composition Type | Fluorine type surfactant composition Amount | Deionized water |
|---|---|---|---|---|---|
| 1 | Example 1 | 3.3 | S-145 | 3.3 | 93.4 |
| 2 | Example 2 | 3.0 | S-381 | 1.5 | 93.7 |
| 3 | Example 3 | 3.0 | S-121 | 3.3 | 93.7 |
| 4 | Example 4 | 3.0 | S-381 | 1.5 | 93.7 |
| 5 | Example 1 | 3.3 | Nil | 0 | 96.7 |
| 6 | Example 2 | 3.0 | Nil | 0 | 97.0 |
| 7 | Example 3 | 3.0 | Nil | 0 | 97.0 |
| 8 | Example 5 | 3.0 | Nil | 0 | 97.0 |
| 9 | Example 6 | 3.0 | S-145 | 3.3 | 93.7 |

Method for evaluating the performance and evaluation results (1) Evaluation of Wettability (Surface tension)

To evaluate the wettabilities of compositions 1 to 9, the surface tensions at room temperature were measured by a Wilhelmy surface tension meter. The results (unit: mN/m) are shown in Table 3.

(2) Evaluation of film-forming property

Compositions 1 to 9 were coated on a non-soldered side of a printed substrate having 2,000 through-holes per sheet and then heat-treated at 120° C. for 5 minutes to remove water and to form coating films. The surface conditions of the coating films were visually inspected and evaluated under the following standards. The results are shown in Table 3.

A: Film with a uniform thickness and gloss on the surface.
B: Film with a non-uniform thickness without gloss on the surface.
C: Film whitened entirely.

(3) Evaluation of the performance for preventing creeping of a flux (first evaluation)

Into a container, a flux was put to a depth of about 2 mm, and five printed boards having coating films formed on their surfaces, prepared in (2), were placed thereon and left to stand for 1 minute. 1 Minute later, whether or not the flux creeped through the through-holes of the printed boards, was visually inspected, and the total number of holes where creeping was observed, was counted. The results are shown in Table 3.

(4) Evaluation of the deposition (contact angle) of a flux

Each of compositions 1 to 9 was diluted with a 10 wt % ethanol aqueous solution so that the copolymer concentration polymer concentration became 0.2 wt %. 20 Silver-plated phosphor bronze plates as usual materials for switches, were prepared, and they were dipped in the diluted compositions 1 to 9, respectively. Further, heat treatment was carried out at 120° C. for 5 minutes to form coating films on their surfaces.

5 Silver-plated phosphor bronze plates of each composition were selected, and the contact angles of the flux on their surfaces were measured by a droplet type projection contact angle meter manufactured by Kyowa Kaimen Kagaku K. K. The average value of the contact angles is shown in Table 4.

(5) Evaluation of contact resistance

15 Silver-plated phosphor bronze plates having coating films formed, as prepared in (4), were selected, and the contact resistance was measured by a three terminal method using a 1 mm semispherical measuring probe by a contact resistance meter manufactured by KS Buhin Kenkyusho. The measurement was carried out in a room wherein the temperature was controlled to be 23° C. by an air conditioner, and the contact load was 10 gf, and the number of measuring points was five points per sample (total of 75 points). A contact resistance of at most 100 mΩ was regarded as "satisfactory", and the number of satisfactory measured points was obtained. The results are shown in Table 4.

(6) Evaluation of electrical conductivity

Diluted compositions 1 to 8 were coated by dipping in the same manner as in (4) except that 20 tact switches were used instead of the silver-plated phosphor bronze plates. They were soldered to a printed board, whereupon presence or absence of conduction failure was examined. The number of tact switches where conduction failure was observed, is shown in Table 4.

(7) Evaluation of the performance for preventing creeping of a flux (second evaluation)

The tact switch used for the evaluation in (6) was removed from the printed board and disassembled not to impair the surface condition of the lead-wire portion, whereupon presence or absence of creeping of the flux, was visually evaluated. The number of tact switches having lead wires where the creeping was observed, was counted. The results are shown in Table 4.

(8) Evaluation of the scratch resistance

The silver-plated phosphor bronze plates having coating films formed, as prepared in (4), were used for the evaluation of the scratch resistance. Each surface of the coating film on the silver-plated phosphor bronze plate was scratched with pencils having various hardness to investigate whether scratch is formed thereon.

The hardness of the pencils used was H, F, HB, B, 2B, 4B or 6B in the order of from large to small hardness. The largest hardness of the pencil among which had not form scratches was measured, and shown in Table 5.

(9) Evaluation of the stripping resistance

The silver-plated phosphor bronze plates having coating films formed, as prepared in (4), were used for the evaluation of the stripping resistance. A piece of "Cellotape" tape (No.405, manufactured by Nichiban Co. Ltd.) was placed on the coating films and pressed with a pressure of $1\times10^5$ Pa.

After left for 1 minute, the tape was stripped from the coating films. The deposition (contact angle) of the part of the coating films on which the tape had been placed was carried out in the same manner as in the above-mentioned (4). The smaller in decrease of the contact angle, the higher in the stripping resistance. The result are shown in Table 5.

TABLE 3

| Composition | Wett-ability: mN/m | Film forming property | Performance for preventing creeping of a flux (first evaluation): hole(s) |
|---|---|---|---|
| 1 | 20 | A | 0 |
| 2 | 21 | A | 0 |
| 3 | 19 | A | 0 |
| 4 | 20 | A | 0 |
| 5 | 42 | B | 20 |
| 6 | 43 | B | 15 |
| 7 | 47 | B | 7 |
| 8 | 45 | C | 894 |
| 9 | 20 | A | 1 |

TABLE 4

| Composition | Deposition of a flux: degree | Contact resistance: points | Electrical conductivity | Performance for preventing creeping of a flux (Second evaluation) |
|---|---|---|---|---|
| 1 | 61 | 75 | 0 | 0 |
| 2 | 61 | 75 | 0 | 0 |
| 3 | 63 | 75 | 0 | 0 |
| 4 | 62 | 75 | 0 | 0 |
| 5 | 54 | 56 | 2 | 2 |
| 6 | 56 | 42 | 5 | 4 |
| 7 | 55 | 62 | 3 | 3 |
| 8 | 28 | 35 | 6 | 13 |
| 9 | 61 | 75 | 0 | 0 |

TABLE 5

| Composition | Scratch resistance | Stripping Resistance (degree) |
|---|---|---|
| 1 | B | 59 |
| 2 | HB | 61 |
| 3 | 1B | 59 |
| 4 | HB | 62 |
| 5 | B | 53 |
| 6 | B | 54 |
| 7 | B | 52 |
| 8 | 6B | 10 |
| 9 | 4B | 14 |

As shown above, the composition for preventing creeping of a flux of the present invention is excellent in the performance for preventing creeping of a flux. The electrical conductivity of electronic parts coated by the present invention is also in excellent and no reduction in the contact resistance can be observed.

Further, the composition containing the polymer including the polymer unit ($b^1$) in the present invention, is excellent in the scratch resistance and the stripping resistance as well as in the performance for preventing creeping of a flux.

INDUSTRIAL APPLICABILITY

The composition of the present invention is a non-flammable aqueous composition free from a trouble of destruction of the ozone layer or warming up the earth. With said composition, there is no substantial problem of odor, which is very advantageous from the viewpoint of working environment.

With said composition, the coating film is effectively formed. Thus, even when it is applied by efficient dip coating, the coating film formed is excellent in the outer appearance, in the uniformity of the film thickness and also in the strength. Further, simply by adjusting the concentration of the polymer in the composition, a coating film having a proper film thickness can be formed, and conduction failure can be prevented. Moreover, it is excellent also in the wettability of a flux, and a conventional treating method can be employed. The composition of the present invention exhibits an excellent performance for preventing creeping of a flux.

What is claimed is:

1. A method for soldering an electronic part or printed board which comprises forming a coating film of a composition on a part or the whole surface of an electronic part or a printed board, then treating the surface having the coating film thus formed, with a flux for soldering, and then carrying out soldering; wherein the composition comprises a polymer (A) containing polymer units ($a^1$) and polymer units ($b^1$), and an aqueous medium (B); wherein the polymer units ($a^1$) are derived from an unsaturated ester containing a polyfluoroalkyl group, or polymer units derived from an unsaturated ester containing a polyfluoroalkyl group having an etheric oxygen atom inserted in the carbon-carbon bond; and polymer units ($b^1$) derived from a compound containing a silicon atom and an unsaturated group.

2. A method for soldering an electronic part or printed board as claimed in claim 1, wherein polymer (A) of the composition further comprises polymer units ($c^1$) other than the polymer units ($a^1$) and the polymer units ($b^1$); wherein the polymer units ($c^1$) are derived from a monomer containing a polymerizable unsaturated group, no $R^f$ group, and no silicon atom.

3. A soldered electronic part or printed board, obtained by the method as defined in claim 1.

4. A soldered electronic part or printed board, obtained by the method as defined in claim 2.

5. An electric appliance employing the electronic part or printed board as defined in claim 3.

6. An electric appliance employing the electronic part or printed board as defined in claim 4.

7. A method for soldering an electronic part or printed board as claimed in claim 1, wherein the polymer units ($a^1$) of the composition are derived from a compound represented by the following formula (1):

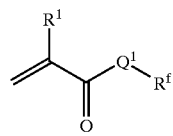

(1)

provided that in the formula (1), $Q^1$, $R^1$ and $R^f$ have the following meanings:
$Q^1$ is a single bond or a bivalent connecting group,
$R^1$ is a hydrogen atom or a methyl group, and
$R^f$ is a polyfluoroalkyl group, or a polyfluoroalkyl group having an etheric oxygen atom inserted in the carbon-carbon bond.

8. A method for soldering an electronic part or printed board as claimed in claim 1, wherein the polymer unit ($b^1$) of the composition is a polymer unit of the compound having the following formula (2):

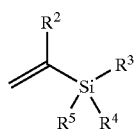

(2)

provided that in the formula (2), $R^2$, $R^3$, $R^4$ and $R^5$ have the following meanings:
$R^2$ is a hydrogen atom or a methyl group and
$R^3$, $R^4$ and $R^5$ are independent from one another, an alkyl group having a carbon number of from 1 to 5, or an alkoxy group having a carbon number of from 1 to 5.

9. A method for soldering an electronic part or printed board as claimed in claim 1, wherein the polymer units ($a^1$) are derived from a compound represented by the following formula (1):

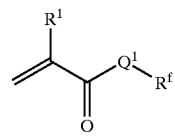

(1)

provided that in the formula (1), $Q^1$, $R^1$ and $R^f$ have the following meanings:
$Q^1$ is a single bond or a bivalent connecting group,
$R^1$ is a hydrogen atom or a methyl group, and
$R^f$ is a polyfluoroalkyl group, or a polyfluoroalkyl group having an etheric oxygen atom inserted in the carbon-carbon bond, and wherein
the polymer units ($b^1$) are derived from a compound having the following formula (2):

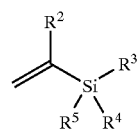

(2)

provided that in the formula (2), $R^2$, $R^3$, $R^4$ and $R^5$ have the following meanings:
$R^2$ is a hydrogen atom or a methyl group and
$R^3$, $R^4$ and $R^5$ are independent from one another, an alkyl group having a carbon number of from 1 to 5, or an alkoxy group having a carbon number of from 1 to 5.

10. A method for soldering an electronic part or printed board as claimed in claim 1, wherein the polymer (A) further comprises a fluorine type surfactant (C).

11. A method for soldering an electronic part or printed board as claimed in claim 1, wherein the softening point of the polymer (A) is at least 40° C. and less than 150° C.

12. A method for soldering an electronic part or printed board as claimed in claim 1, wherein the aqueous medium (B) contains a water-soluble organic solvent, and the boiling point of the water-soluble organic solvent is from 40 to 200° C.

13. A method for soldering an electronic part or printed board as claimed in claim 1, wherein the surface tension of the composition is from 10 to 25 mN/m.

14. A method for soldering an electronic part or printed board as claimed in claim 7, wherein the polymer (A) of the composition further comprises polymer units ($c^1$) other than the polymer units ($a^1$) and the polymer units ($b^1$); wherein the polymer units ($c^1$) are derived from a monomer containing a polymerizable unsaturated group, with no $R^f$ group and no silicon atom.

15. A method for soldering an electronic part or printed board as claimed in claim 8, wherein the polymer (A) further comprises polymer units ($c^1$) other than the polymer units ($a^1$) and the polymer units ($b^1$); wherein the polymer units ($c^1$) are derived from a monomer containing a polymerizable unsaturated group, with no $R^f$ group and no silicon atom.

16. A method for soldering an electronic part or printed board as claimed in claim 9, wherein the polymer (A) further comprises polymer units ($c^1$) other than the polymer units ($a^1$) and the polymer units ($b^1$); wherein the polymer units ($c^1$) are derived from a monomer containing a polymerizable unsaturated group, with no $R^f$ group and no silicon atom.

17. A method for soldering an electronic part or printed board as claimed in claim 2, wherein the polymer units ($c^1$) are polymer units derived from at least one monomer selected from the group consisting of ethylene, vinyl chloride, styrene, (meth)acrylic acid, cyclohexyl(meth) acrylate, an alkyl(meth)acrylate, a mono(meth)acrylate of a polyoxyalkylene diol, and glycidyl(meth)acrylate.

18. A method for soldering an electronic part or printed board as claimed in claim 14, wherein the polymer units ($c^1$) are polymer units derived from at least one monomer selected from the group consisting of ethylene, vinyl chloride, styrene, (meth)acrylic acid, cyclohexyl(meth) acrylate, an alkyl(meth)acrylate, a mono(meth)acrylate of a polyoxyalkylene diol, and glycidyl(meth)acrylate.

19. A method for soldering an electronic part or printed board as claimed in claim 15, wherein the polymer units ($c^1$) are polymer units derived from at least one monomer selected from the group consisting of ethylene, vinyl chloride, styrene, (meth)acrylic acid, cyclohexyl(meth) acrylate, an alkyl(meth)acrylate, a mono(meth)acrylate of a polyoxyalkylene diol, and glycidyl(meth)acrylate.

20. A method for soldering an electronic part or printed board as claimed in claim 16, wherein the polymer units ($c^1$) are polymer units derived from at least one monomer selected from the group consisting of ethylene, vinyl chloride, styrene, (meth)acrylic acid, cyclohexyl(meth) acrylate, an alkyl(meth)acrylate, a mono(meth)acrylate of a polyoxyalkylene diol, and glycidyl(meth)acrylate.

21. A method for soldering an electronic part or printed board as claimed in claim 2, wherein the polymer units ($a^1$) are polymer units derived from $R^f$—OCOCH=CH$_2$, the polymer units ($b^1$) are polymer units derived from $CH_2$=CHSi(OR$^6$)$_3$, and the polymer units ($c^1$) are polymer units derived from cyclohexyl(meth)acrylate, wherein $R^f$ is a polyfluoroalkyl group, or a polyfluoroalkyl group having an etheric oxygen atom inserted in the carbon-carbon bond and $R^6$ is an alkyl group having a carbon number of from 1 to 3.

* * * * *